(12) United States Patent
Ke et al.

(10) Patent No.: US 8,026,602 B2
(45) Date of Patent: Sep. 27, 2011

(54) FABRICATION METHOD OF SEMICONDUCTOR DEVICE HAVING CONDUCTIVE BUMPS

(75) Inventors: Chun-Chi Ke, Taichung (TW); Chien-Ping Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 12/872,164

(22) Filed: Aug. 31, 2010

(65) Prior Publication Data
US 2010/0323513 A1 Dec. 23, 2010

Related U.S. Application Data

(62) Division of application No. 12/005,764, filed on Dec. 27, 2007, now Pat. No. 7,804,173.

(30) Foreign Application Priority Data

Dec. 28, 2006 (TW) ............................... 95149395 A

(51) Int. Cl.
*H01L 23/48* (2006.01)
*H01L 23/52* (2006.01)
*H01L 29/40* (2006.01)
(52) U.S. Cl. . 257/737; 257/779; 257/780; 257/E23.021; 257/E21.508
(58) Field of Classification Search .................. 257/737, 257/738, 758, 778, 779, 780, E23.021, E21.508
See application file for complete search history.

(56) References Cited

U.S. PATENT DOCUMENTS

| | | | |
|---|---|---|---|
| 5,466,635 A | 11/1995 | Lynch et al. | |
| 5,656,858 A | 8/1997 | Kondo et al. | |
| 5,757,079 A * | 5/1998 | McAllister et al. | 257/776 |
| 6,107,180 A | 8/2000 | Munroe et al. | |
| 6,111,321 A | 8/2000 | Agarwala | |
| 6,229,220 B1 | 5/2001 | Saitoh et al. | |
| 6,297,553 B1 * | 10/2001 | Horiuchi et al. | 257/737 |
| 6,396,148 B1 * | 5/2002 | Eichelberger et al. | 257/758 |
| 6,578,754 B1 | 6/2003 | Tung | |
| 6,586,323 B1 * | 7/2003 | Fan et al. | 438/614 |
| 6,621,154 B1 * | 9/2003 | Satoh et al. | 257/684 |
| 6,759,739 B2 * | 7/2004 | Nakamura et al. | 257/700 |
| 6,770,971 B2 * | 8/2004 | Kouno et al. | 257/734 |
| 6,841,875 B2 * | 1/2005 | Ohsumi | 257/738 |
| 6,870,267 B2 * | 3/2005 | Zohni | 257/773 |
| 2004/0032028 A1 * | 2/2004 | Pai et al. | 257/758 |
| 2004/0155352 A1 * | 8/2004 | Ma | 257/758 |
| 2005/0098891 A1 * | 5/2005 | Wakabayashi et al. | 257/758 |

(Continued)

*Primary Examiner* — Minh-Loan T Tran
*Assistant Examiner* — Teresa M Arroyo
(74) *Attorney, Agent, or Firm* — Peter F. Corless; Steven M. Jensen; Edwards Angell Palmer & Dodge LLP

(57) ABSTRACT

A semiconductor device having conductive bumps and a fabrication method thereof are provided. The fabrication method mainly including steps of: providing a semiconductor substrate having a solder pad and a passivation layer formed thereon with a portion of the solder pads exposed from the passivation layer; disposing a first metal layer on the solder pad and a portion of the passivation layer around the solder pad; disposing a covering layer on the first metal layer and the passivation layer, and forming an aperture in the covering layer to expose a portion of the first metal layer, wherein a center of the aperture is deviated from that of the solder pad; deposing a metal pillar on the portion of the first metal layer; and deposing a solder material on an outer surface of the metal pillar for providing a better buffering effect.

12 Claims, 5 Drawing Sheets

U.S. PATENT DOCUMENTS

2005/0161823 A1* 7/2005 Jobetto et al. ................. 257/758
2005/0258549 A1* 11/2005 Mathew ........................ 257/779
2006/0202344 A1* 9/2006 Takada et al. ................. 257/758
2006/0249848 A1* 11/2006 Coolbaugh et al. ........... 257/758

* cited by examiner

FABRICATION METHOD OF SEMICONDUCTOR DEVICE HAVING CONDUCTIVE BUMPS

CROSS-REFERENCE TO RELATED APPLICATION(S)

This application is a divisional of copending application U.S. Ser. No. 12/005,764, filed on Dec. 27, 2007.

BACKGROUND OF THE INVENTION

1. Field of the Invention

This invention generally relates to a semiconductor device and a fabrication method thereof, and more specifically, to a semiconductor device having conductive bumps and a fabrication method thereof.

2. Description of Related Art

Mainly, the conventional flip chip semiconductor package technique with solder bumps formed on solder pads of chips, and via the solder bumps, the chips are directly and electrically connected to a chip carrier. In comparison with the wire bonding technique, such flip chip technique has shorter circuit route, and better electricity quality, and it also has better heat dissipation efficiency for chips as its availability to be designed with uncovered chips.

As disclosed in U.S. Pat. Nos. 6,111,321, 6,107,180, and 6,586,323, an under bump metallurgy (UBM) is formed in such flip chip technique before the formation of the solder bumps in order to have the solder bumps steadily glued onto the solder pads of the chip as disclosed in the prior art. However, during a solder reflow process for directly and electrically connecting the chip to the chip carrier via the solder bumps, the solder bumps melt when the temperature reaches a certain point, which causes collapsing, namely wetting, of the solder bumps. Such collapsing will result in an undesired bridging of neighboring solder bumps, which causes electricity failure of the package.

Please refer to FIG. 1A, which is a schematic view showing a semiconductor package disclosed in U.S. Pat. Nos. 6,229,220, 5,656,858, 5,466,635, and 6,578,754. A copper post 15 of about 30~90 μm in height is formed on top of a metal layer 14 of a solder pad 11 of a chip 10, and a solder material 16 is formed on the copper cylinder 15. Thus at the time the chip 10 is electrically connected to a chip carrier (not shown) by means of flip chip technique, the copper post 15 effectively supports the chip 10 and prevents the package from the conventional problem of collapsing of the solder bumps.

Although the aforementioned conductive bump with high supporting capability is capable of absorbing more thermal stress when the difference between the thermal expansion coefficients of the chip and the chip carrier is high, it is undesirable to be applied to a large-sized chip, for example, a 15*15 mm chip for the following reason. In such case, some conductive bumps that have copper post are formed around corners of the chip, and they receive relatively high thermal stress as they are positioned far from the center of the chip. Thus the relatively high stress from the copper post still not efficiently absorbed by the under bump metal layer, and therein cracks and cracked delamination C of the under bump metal layer will happen easily as illustrated in FIG. 1B.

Hence, it is a highly urgent issue in the industry for how to provide a semiconductor device that has conductive bumps, which is applicable to large-sized chips that have conductive bumps with copper post for absorbing the stress from the copper post efficiently, and further avoiding the drawbacks of cracks and delamination of the under bump metal layer.

SUMMARY OF THE INVENTION

In view of the aforementioned disadvantages in the prior art, it is a primary objective of the present invention to provide a semiconductor device having conductive bumps and a fabrication method thereof, wherein, each conductive bump has a metal pillar and the semiconductor device having conductive bumps is capable of effectively absorbing stresses transmitted from the metal pillars.

It is another objective of the present invention to provide a semiconductor device having conductive bumps and a fabrication method thereof, which are capable of avoiding the conventional problems of cracks and delamination of an under bump metal layer that is formed on each solder pad of a large-sized chip.

To achieve the aforementioned and other objectives, a semiconductor device having conductive bumps and a fabrication method thereof are provided according to the present invention. The fabrication method comprises: providing a semiconductor substrate having a solder pad and a passivation layer formed thereon and a portion of the solder pad exposed from the passivation layer; disposing a first metal layer on the solder pad and a portion of the passivation layer around the solder pad; disposing a first covering layer on the passivation layer and the first metal layer; forming an aperture on the first covering layer for exposing a portion of the first metal layer, wherein, a center of the aperture is deviated from that of the solder pad; disposing a metal pillar on the portion of the first metal layer so as to electrically connect the metal pillar to the first metal layer; and disposing a solder material on the metal pillar.

The fabrication method of the semiconductor device having conductive bumps further comprises a step of: forming a second metal layer on the portion of the first metal layer such that the second metal layer is electrically connected to the first metal layer and the metal pillar and the solder material are disposed on the second metal layer.

In addition, before disposing the first metal layer, the fabrication method of the semiconductor device having conductive bumps further comprises a step of: disposing a second covering layer on the passivation layer and the solder pad of the substrate with a part of the portion of the solder pad exposed from the second covering layer such that the first metal layer is disposed on the second covering layer and the first metal layer is electrically connected to the solder pad.

A deviation distance between the centers of the apertures of the first covering layer and the solder pad is smaller than half a width of the solder pad. Preferably, the deviation distance is a quarter of the width of the solder pad. The semiconductor substrate can be a semiconductor chip or a wafer, the passivation layer can be a polyimide layer or a silicon nitride (SiN) layer, the second covering layer can be a dielectric layer of benzo-cyclo-butene (BCB) or polyimide, the first covering layer can be a dielectric layer or a solder mask, and the first and the second metal layers can be layers of, for example, under bump metallurgy (UBM).

The present invention further discloses a semiconductor device having conductive bumps, which comprises: a semiconductor substrate, which has a solder pad and a passivation layer formed thereon, wherein the semiconductor substrate is covered by and the solder pad is exposed from the passivation layer; a first metal layer, which is disposed on the solder pad and a portion of the passivation layer around the solder pad; a first covering layer, which is disposed on the passivation layer and the first metal layer and having an aperture for exposing a portion of the first metal layer, wherein, a center of the aperture is deviated from that of the solder pad; a metal pillar disposed on the portion of the first metal layer so as to electrically connect the metal pillar to the first metal layer; and a solder material disposed on the metal pillar.

In addition, the semiconductor device having conductive bumps further comprises a second metal layer, which is disposed on the portion of the first metal layer such that the second metal layer is electrically connected to the first metal layer, and the metal pillar and the solder material are disposed on the second metal layer. The first and the second metal layers are layers of, for example, under bump metallurgy (UBM).

Furthermore, the semiconductor device having conductive bumps further comprises a second covering layer disposed on the passivation layer and the solder pads of the semiconductor substrate with a part of the portion of the solder pad exposed from the second covering layer, such that the first metal layer is disposed on the second covering layer, and the first metal layer is electrically connected to the part of the portion of the solder pad that is exposed from the second covering layer.

Compared with the prior art, the semiconductor device having conductive bumps and the fabrication method thereof according to the present invention mainly comprises: disposing a covering layer between a conductive bump having a metal pillar and a first metal layer of, for example, an under bump metallurgy, wherein the covering layer has an aperture for exposing a potion of the first metal layer, a center of the aperture is deviated from that of the solder pad for a deviation distance being smaller than half a width of the solder pad. Accordingly, the metal pillar and the solder material, which are subsequently formed on the portion of the first metal layer that is exposed from the aperture of the covering layer, can be simultaneously mounted on the first metal layer and the passivation layer and covering layer with larger carrying area above the passivation layer and covering layer in a position which is deviated from the center of the solder pad, thereby providing a better buffering effect and preventing the semiconductor device from the conventional problems of cracks and delamination of the under bump metallurgy.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

First Embodiment

Please refer to FIGS. 2A to 2E, which are sectional views showing a semiconductor device having conductive bumps and a fabrication method thereof according to a first embodiment of the present invention.

Figure 1A:
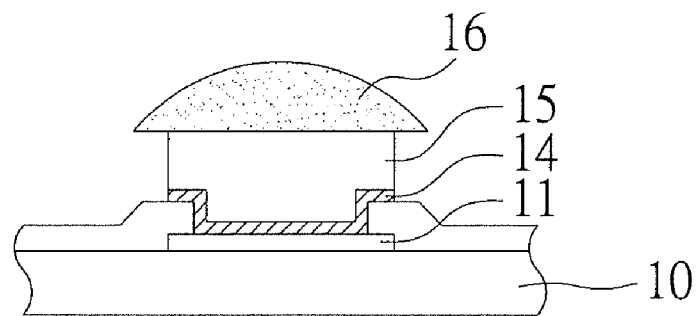
FIG. 1A is a schematic view showing a formation of a conductive bump having a copper cylinder on an under bump metallurgy of a chip according to the prior art.
Figure 1B:
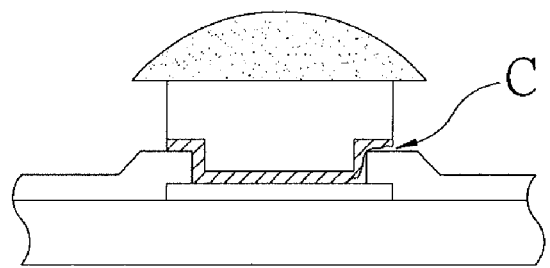
FIG. 1B is a schematic view showing a delamination of the under bump metallurgy due to the overstress delivered from the copper post of the conductive bump according to the prior art.
Figure 2A:
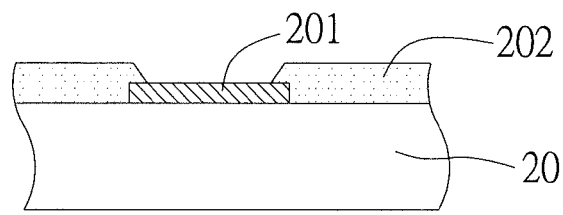
FIGS. 2A-2E are schematic views showing a semiconductor device having conductive bumps and a fabrication method thereof according to a first embodiment of the present invention.

As shown in FIG. 2A, a semiconductor substrate 20 is provided and has a plurality of solder pads 201 and a passivation layer 202 preformed on the semiconductor substrate 20 (for simplifying the descriptions, an area with single solder pad 201 is illustrated), where the semiconductor substrate 20 is, for example, a semiconductor chip or a wafer that has a plurality of chips, a surface of the semiconductor substrate 20 is covered with the passivation layer 202, and the passivation layer 202 has an aperture for exposing the solder pad 201 therefrom. The material of the passivation layer 202 is, for example, polyamide (PI) or silicon nitride, for protecting the semiconductor substrate 20.

Figure 2B:
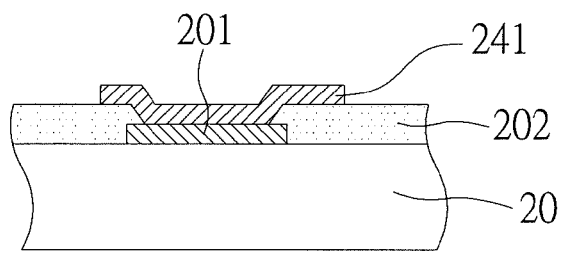

As shown in FIG. 2B, a first metal layer 241 is formed directly on the passivation layer 202 and the solder pad 201 and electrically connected to the surface of the solder pad 201 which is exposed from the passivation layer 202. The first metal layer 241 is, for example, an under bump metallurgy, and can be made of one selected from a group consisting of aluminum, nickel vanadium alloy, copper, and titanium.

Figure 2C:
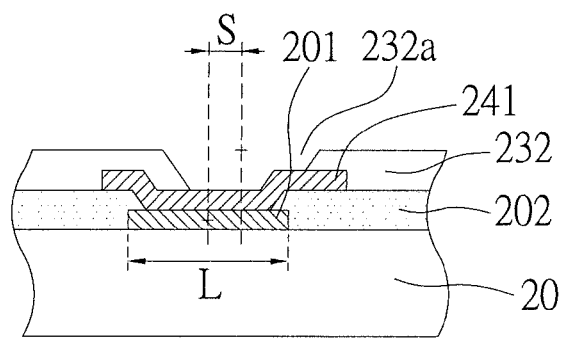

As shown in FIG. 2C, a covering layer 232 is disposed for covering the passivation layer 202 and the first metal layer 241, and an aperture 232a is formed in the covering layer 232 for exposing a portion of the first metal layer 241. A center of the aperture 232a is deviated from that of the solder pad 201 for a deviation distance S, which is smaller than half a width of the solder pad 201. The deviation distance S shown herein is equal to a quarter of the width of the solder pad 201, but not restricted to this, any value of the deviation distance S that is smaller than a half of the width of the solder pad 201 falls in the scope of the application. The covering layer 232 can be a dielectric layer or a solder mask, and the dielectric layer can be benzo-cyclo-butene (BCB) or polyimide (PI).

Figure 2D:
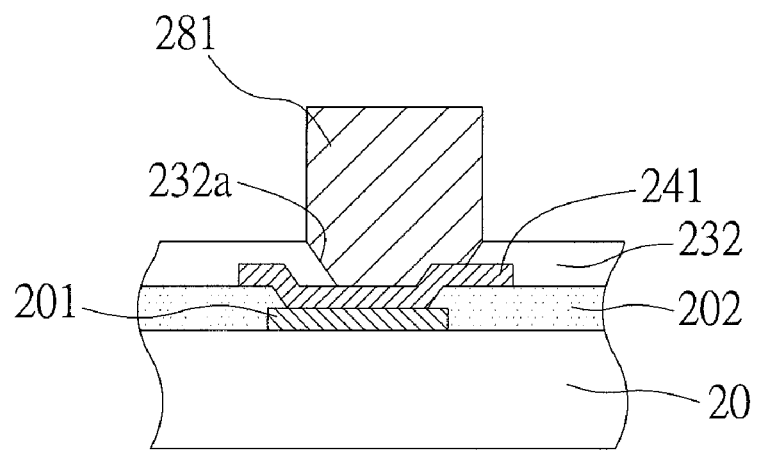

As shown in FIG. 2D, a metal pillar 281, for example, a copper pillar, is disposed on the portion of the first metal layer 241, which is exposed from the aperture 232a, by means of, for example, electroplating, so as to electrically connect the metal pillar 281 to the first metal layer 241.

Figure 2E:
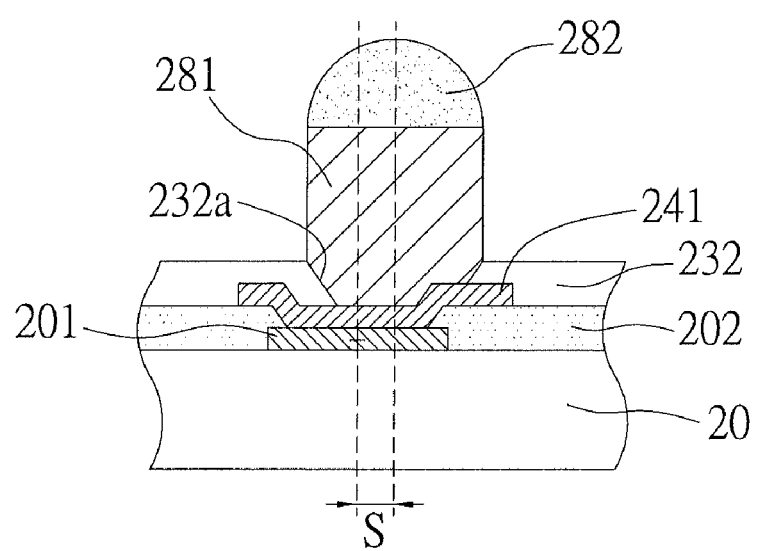

As shown in FIG. 2E, a cap-shaped solder material 282 is disposed on an outer surface of the metal pillar 281.

By means of the aforementioned fabrication method, the present invention further discloses a semiconductor device that has conductive bumps, the semiconductor device having conductive bumps comprises: the semiconductor substrate 20 having a solder pad 201 and the passivation layer 202 formed on the surface of the semiconductor substrate 20, where the semiconductor substrate 20 is covered by the passivation layer 202 and the solder pad 201 is exposed from passivation layer 202; a first metal layer 241 disposed on the solder pad 201 and a portion of the passivation layer 202 around the solder pad 201; a covering layer 232 disposed on the passivation layer 202 and the first metal layer 241, and having an aperture 232a for exposing a portion of the first metal layer 241, wherein the center of the aperture 232a is deviated from that of the solder pad 201; the metal pillar 281 disposed on the portion of the first metal layer 241 that is exposed from the aperture 232a of the covering layer 232, so as to electrically connect to the metal pillar 281 to the first metal layer 241; and the solder material 282 disposed on the outer surface of the metal pillar 282.

In summary, a semiconductor device having conductive bumps and a fabrication method thereof of the present invention mainly disposing a covering layer between a conductive bump having a metal pillar and a first metal layer of, for example, an under bump metallurgy, wherein the covering layer has an aperture for exposing a potion of the first metal layer, a center of the aperture is deviated from that of the solder pad for a deviation distance being smaller than half a width of the solder pad. Accordingly, the metal pillar and the solder material, which are subsequently formed on the portion of the first metal layer that is exposed from the aperture of the covering layer, can be simultaneously mounted on the first metal layer and the passivation layer and covering layer with larger carrying area above the passivation layer and the covering layer in a position which is deviated from the center of the solder pad, thereby providing a better buffering effect and preventing the semiconductor device from the conventional problems of cracks and delamination of the under bump metallurgy due to the relatively high stress on a large-sized chip.

Second Embodiment

Figure 3:
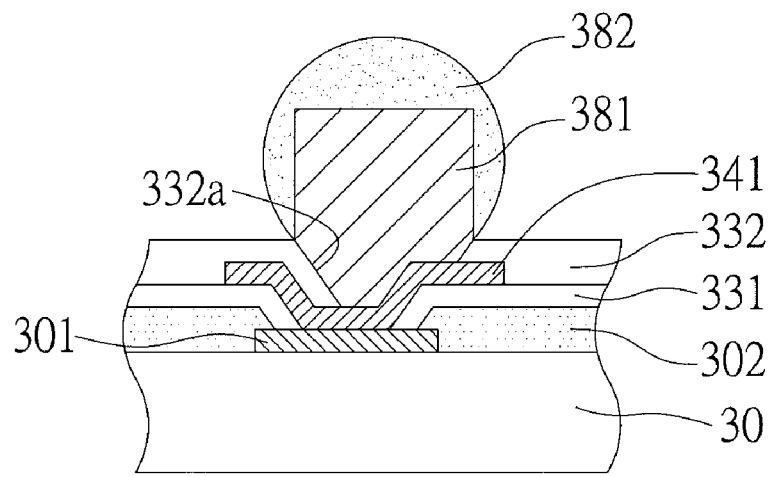
FIG. 3 is a schematic view showing a semiconductor device having conductive bumps according to a second embodiment of the present invention.

Please refer to FIG. 3, which is a sectional view showing a semiconductor device having conductive bumps according to a second embodiment of the present invention. The semiconductor device having conductive bumps of the present embodiment is similar to that in the first embodiment, the major difference therebetween is that the semiconductor device having conductive bumps of the present embodiment further comprising another covering layer disposed on the passivation layer, which is useful when the material of the passivation layer of the semiconductor substrate is, for example, a nitride (such as silicon nitride).

As shown in FIG. 3, the semiconductor device having conductive bumps of the present embodiment comprises: a semiconductor substrate 30, a plurality of solder pads 301 (only one is illustrated for simplifying the description) and a passivation layer 302 formed on a surface of the semiconductor substrate 30; a covering layer 331 disposed on the passivation layer 302 and the solder pad 301 with a portion of the solder pad 301 exposed therefrom; a first metal layer 341 disposed on the solder pad 301 and a portion of the covering layer 331 around the solder pad 301; another covering layer 332 disposed on the covering layer 331 and the first metal layer 341 and having an aperture 332a for exposing a portion of the first metal layer 341, wherein, a center of the aperture 332a is deviated from that of the solder pad 301; a metal pillar 381 disposed on portion of the first metal layer 341 that is exposed from the aperture 332a; and a solder material 382, which is, for example, a ball-shaped solder material, is disposed on an outer surface of the metal pillar 381.

Preferably, the covering layer 331 is benzo-cyclo-butene (BCB) or polyimide, and the first metal layer 341 is, for example, an under bump metallurgy (UBM).

Third Embodiment

Figure 4:
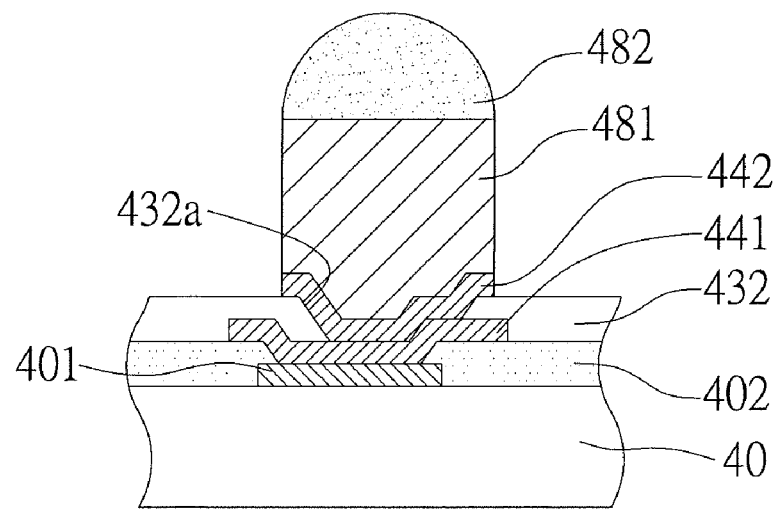
FIG. 4 is a schematic view showing a semiconductor device having conductive bumps according to a third embodiment of the present invention.

Please refer to FIG. 4, which is a sectional view showing a semiconductor device having conductive bumps according to a third embodiment of the present invention. The semiconductor device having conductive bumps of the present embodiment is similar to that in the first embodiment, the major differences therebetween are that the semiconductor device having conductive bumps of the present embodiment further comprising another metal layer. A shown in FIG. 4, a first metal layer 441 is directly disposed on top of the solder pad 401 and a passivation layer 402, which are both formed on a surface of a semiconductor substrate 40, so as to electrically connect the first metal layer 441 to a portion of the solder pad 401 which is exposed from the passivation layer 402. Next, a covering layer 432 is disposed on the first metal layer 441 and the passivation layer 402, wherein the covering layer 432 having an aperture 432a formed therein for exposing a portion of the first metal layer 441, and a center of the aperture 432a is deviated from that of the solder pad 401. Then a second metal layer 442 is disposed on the portion of first metal layer 441 which is exposed from aperture 432a of the covering layer 432, so as to electrically connect the second metal layer 442 to the first metal layer 441. At last, a metal pillar 481 and a cap-shaped solder material 482 are disposed on the second metal layer 442.

Fourth Embodiment

Figure 5:
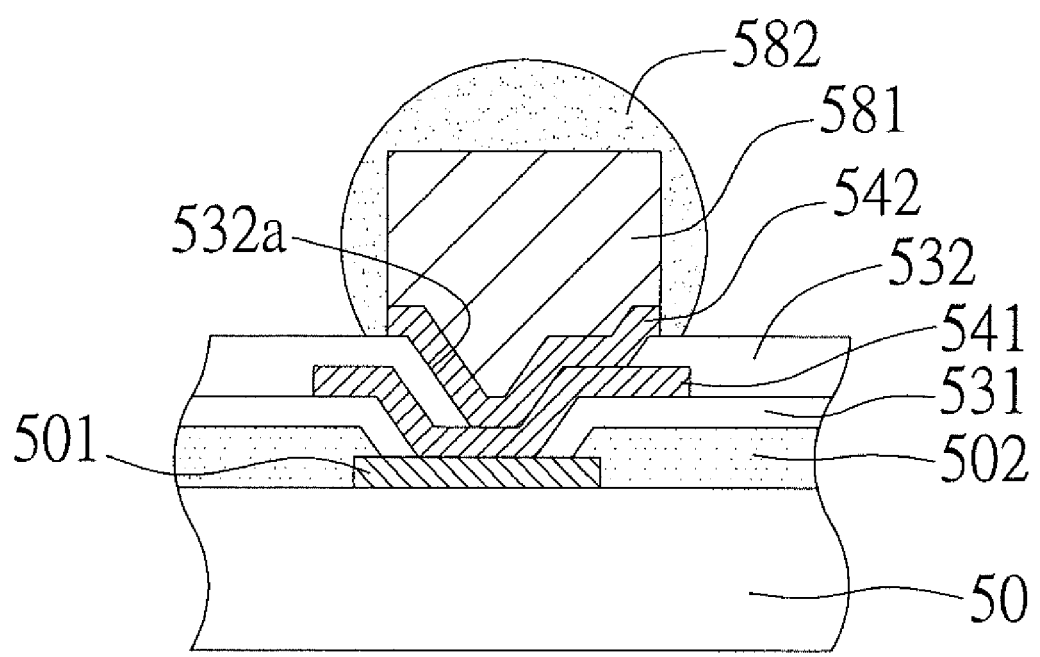
FIG. 5 is schematic view showing a semiconductor device having conductive bumps according to a fourth embodiment of the present invention.

Please refer to FIG. 5, which is a sectional view showing a semiconductor device having conductive bumps according to a fourth embodiment of the present invention. The semiconductor device having conductive bumps of the present embodiment is similar to that in the second embodiment.

The semiconductor device having conductive bumps of the present embodiment comprises: a semiconductor substrate 50, a plurality of solder pads 501 (only one is illustrated herein) and a passivation layer 502 formed on a surface of the semiconductor substrate 50 with a portion of the solder pads 501 exposed from the passivation layer 502; a covering layer 531 disposed on the passivation layer 502 and the solder pad 501 with a part of the portion of the solder pads 501 exposed from the covering layer 531; a first metal layer 541 disposed on the solder pad 501 and a portion of the covering layer 531 around the solder pad 501; another covering layer 532 disposed on the covering layer 531 and the first metal layer 541 and having an aperture 532a formed therein for exposing a portion of the first metal layer 541, wherein a center of the aperture 532a is deviated from that the solder pad 501; a second metal layer 542 disposed on the portion of the first metal layer 541 which is exposed from the aperture 532a of the covering layer 532, so as to electrically connect the second metal layer 542 to the first metal layer 541; a metal pillar 581 disposed on top of the second metal layer 542; and a solder material 582, which is a ball-shaped solder material, is disposed on an outer surface of the metal pillar 581.

The first metal layer 541 and the second metal layer 542 are, for example, layers of under bump metallurgy that enables the metal pillar 581 to be fully mounted on the second metal layer (the under bump metallurgy), thereby enhancing the mounting effect.

There is a deviation distance between centers of the solder pad and the conductive bump that is made up of the metal pillar and the solder material, thus the metal pillar and the solder material can be mounded at the same time on the first metal layer and the passivation layer and covering layer with larger carrying areas above the passivation layer and the covering layer, thereby providing a better buffer effect.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A fabrication method of a semiconductor device having conductive bumps, comprising the steps of:
    providing a semiconductor substrate having a solder pad and a passivation layer formed thereon with the semiconductor substrate covered by and a portion of the solder pad exposed from the passivation layer;
    disposing a first metal layer on the solder pad and a portion of the passivation layer around the solder pad;
    disposing a covering layer on the passivation layer and the first metal layer;
    forming an aperture on the covering layer for exposing a portion of the first metal layer, wherein a center of the aperture is deviated from that of the solder pad, and a deviation distance between the centers of the aperture and the solder pad is smaller than half a width of the solder pad;
    disposing a metal pillar on the portion of the first metal layer; and
    disposing a solder material on the metal pillar.

2. The fabrication method of claim 1, further comprising a step of:
    disposing a second metal layer on the portion of the first metal layer so as to electrically connect the second metal layer to the first metal layer such that the metal pillar and the solder material are formed on the second metal layer.

3. The fabrication method of claim 2, wherein the first and the second metal layers are layers of under bump metallurgy.

4. The fabrication method of claim 1, wherein the passivation layer is a polyimide layer and the covering layer is one of a dielectric layer and a solder mask.

5. The fabrication method of claim 1, wherein the semiconductor substrate is one of a semiconductor chip and a wafer having a plurality of chips.

6. The fabrication method of claim 1, wherein the solder material is one of a ball-shaped solder material and a cap-shaped solder material.

7. A fabrication method of a semiconductor device having conductive bumps, comprising the steps of:
    providing a semiconductor substrate having a solder pad and a passivation layer formed thereon with the semiconductor substrate covered by and a portion of the solder pad exposed from the passivation layer;
    disposing a first covering layer on the solder pad and the passivation layer with a part of the portion of the solder pad exposed from the first covering layer;
    disposing a first metal layer on the solder pad and a portion of the first covering layer around the solder pad, the first metal layer being electrically connected to the solder pad;
    disposing a second covering layer on the first covering layer and the first metal layer;
    forming an aperture on the second covering layer for exposing a portion of the first metal layer, wherein a center of the aperture is deviated from that of the solder pad, and a deviation distance between the centers of the aperture and the solder pad is smaller than half a width of the solder pad;
    disposing a metal pillar on the portion of the first metal layer; and
    disposing a solder material on the metal pillar.

8. The fabrication method of claim 7, wherein the passivation layer is a silicon nitride layer, the second covering layer is a one of a dielectric layer and a solder mask, and the first covering layer is one of a benzo-cyclo-butene layer and a polyimide layer.

9. The fabrication method of claim 7, further comprising a step of:
    disposing a second metal layer on the portion of the first metal layer so as to electrically connect the second metal layer to the first metal layer such that the metal pillar and the solder material are formed on the second metal layer.

10. The fabrication method of claim 9, wherein the first and the second metal layers are layers of under bump metallurgy.

11. The fabrication method of claim 7, wherein the semiconductor substrate is one of a semiconductor chip and a wafer having a plurality of chips.

12. The fabrication method of claim 7, wherein the solder material is one of a ball-shaped solder material and a cap-shaped solder material.

* * * * *